United States Patent
Takai

(10) Patent No.: US 9,846,357 B2
(45) Date of Patent: Dec. 19, 2017

(54) PHOTOMASK MANUFACTURING METHOD AND PHOTOMASK

(71) Applicant: Toshiba Memory Corporation, Tokyo (JP)

(72) Inventor: Kosuke Takai, Yokohama Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 52 days.

(21) Appl. No.: 14/475,557

(22) Filed: Sep. 2, 2014

(65) Prior Publication Data

US 2015/0261081 A1    Sep. 17, 2015

(30) Foreign Application Priority Data

Mar. 14, 2014  (JP) ................................ 2014-052793

(51) Int. Cl.
  *G03F 1/22*  (2012.01)
  *G03F 1/24*  (2012.01)

(52) U.S. Cl.
  CPC ..................... *G03F 1/24* (2013.01)

(58) Field of Classification Search
  CPC ............ G03F 7/704; G03F 7/706; G03F 1/22
  See application file for complete search history.

(56) References Cited

U.S. PATENT DOCUMENTS

| 5,668,042 A * | 9/1997 | Bae ....................... G03F 7/0035 |
| | | 148/DIG. 106 |
| 6,883,158 B1 * | 4/2005 | Sandstrom .............. G03F 7/704 |
| | | 430/5 |
| 7,704,645 B2 | 4/2010 | Mitsui |
| 8,533,634 B2 | 9/2013 | Itoh |

| 2009/0148781 A1 | 6/2009 | Kamo et al. |
| 2014/0170536 A1 * | 6/2014 | Fukugami ................ G03F 1/24 |
| | | 430/5 |
| 2014/0273306 A1 * | 9/2014 | Raghunathan .......... H01L 22/10 |
| | | 438/15 |

FOREIGN PATENT DOCUMENTS

| JP | H03-106015 A | 5/1991 |
| JP | 2001-265012 | 9/2001 |
| JP | 2002-365785 A | 12/2002 |
| JP | 2005-175167 A | 6/2005 |
| JP | 2005-340553 | 12/2005 |
| JP | 2006-352134 | 12/2006 |
| JP | 2008-205291 | 9/2008 |
| JP | 2009-141223 | 6/2009 |
| JP | 2009-151184 | 7/2009 |
| JP | 2009-212220 | 9/2009 |
| JP | 2012-204409 | 10/2012 |

OTHER PUBLICATIONS

Japanese Office Action dated Dec. 26, 2016, filed in Japanese counterpart Patent Application No. 2014-052793, 11 pages (with English translation).
Japanese Office Action dated Jul. 18, 2017, filed in Japanese counterpart Patent Application No. 2014-052793 (10 pages) (with English translation).

* cited by examiner

*Primary Examiner* — Nadine Norton
*Assistant Examiner* — Mahmoud Dahimene
(74) *Attorney, Agent, or Firm* — Patterson & Sheridan LLP

(57) ABSTRACT

According to one embodiment, a photomask manufacturing method for patterning a multilayer film into a mask pattern in the multilayer film is provided. The photomask manufacturing method includes preparing a substrate including the multilayer film provided on the substrate, obtaining an amount of position variation before and after the multilayer film is patterned if a position of the mask pattern is deviated before and after patterning the multilayer film, forming the mask pattern at a position deviated by the amount of the position variation from a target position, if the multilayer film is patterned and a pattern of the multilayer film is formed at the target position, and patterning the multilayer film with the mask pattern.

25 Claims, 6 Drawing Sheets

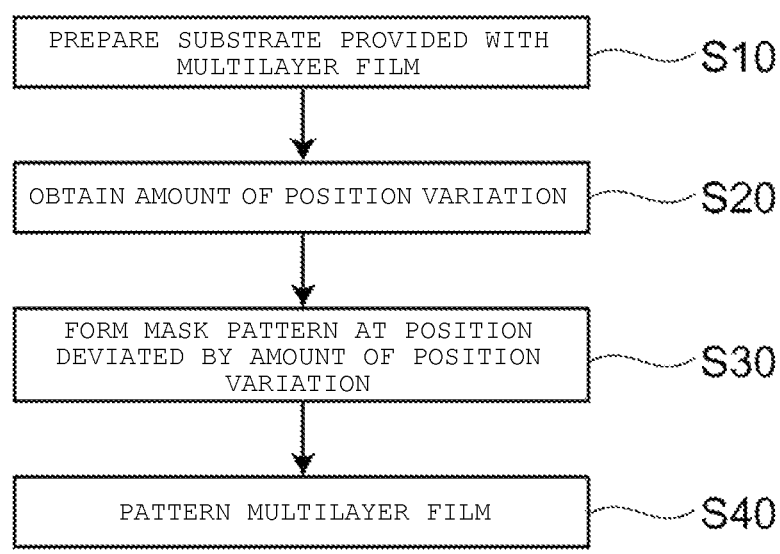

PHOTOMASK MANUFACTURING METHOD AND PHOTOMASK

CROSS-REFERENCE TO RELATED APPLICATION

This application is based upon and claims the benefit of priority from Japanese Patent Application No. 2014-052793, filed Mar. 14, 2014, the entire contents of which are incorporated herein by reference.

FIELD

Embodiments described herein relate generally to a photomask manufacturing method and a photomask.

BACKGROUND

When performing photolithography in which extreme ultraviolet (EUV) light having a light wavelength of several tens of nanometers is used, a photomask used therein is commonly provided with a reflective layer including a multilayer film of metal and silicon.

DESCRIPTION OF THE DRAWINGS

FIG. 1 is a flow chart illustrating a photomask manufacturing method according to an embodiment.

DETAILED DESCRIPTION

Figure 2A:
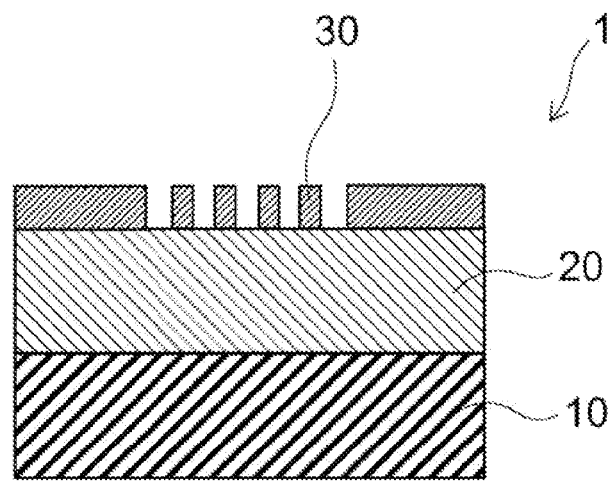
FIGS. 2A to 2C are cross-sectional views schematically illustrating photomasks according to the embodiment.

An embodiment herein provides a method of forming a photomask for photolithography that provides a high manufacturing yield, and the photomask manufactured thereby.

In general, according to one embodiment, there is provided a photomask manufacturing method of patterning a multilayer film using a mask pattern provided on the multilayer film. The photomask manufacturing method includes providing a substrate including the multilayer film thereon; obtaining an amount of position variation before and after the multilayer film is patterned if a position of the mask pattern deviates between the position location before and after patterning the multilayer film; forming the mask pattern at a deviated position altered by the amount of positional variation from a target position which will occur between the desired multilayer film pattern position and a pattern location of the multilayer film actually formed at the target position; and patterning the multilayer film using the mask pattern.

According to an embodiment, there is provided a photomask manufacturing method of patterning a multilayer film included in the photomask by a mask pattern. Further, there is provided the photomask manufactured by the manufacturing method. Here, the multilayer film is provided on a substrate (base metal). The multilayer film and the substrate on which the multilayer film are provided before processing thereof into a mask are collectively referred to as a "mask blank".

Hereinafter, embodiments are described with reference to the drawings. In the description below, the same members are referred to as the same reference numerals, and description of an element previously described will be appropriately omitted where appropriate.

FIG. 1 is a flow chart illustrating a photomask manufacturing method according to the embodiment.

According to the embodiment, useful in EUV lithography where EUV photons are reflected off the patterned mask and focused on a resist layer on a substrate to expose a pattern in the resist, when a multilayer film is processed so that a light reflecting photomask is created using lithographic techniques, displacement of the resulting pattern caused by stress release of the multilayer film occurs, and the actual mask pattern is formed during the mask pattern creation to compensate for that displacement.

As shown in FIG. 1, a substrate provided with a multilayer film on a principal plane is prepared or provided as a mask blank (Step S10).

Subsequently, if a position of the mask pattern deviates before or after the patterning of the multilayer film, the amount of positional variation of the mask pattern before or after the patterning of the multilayer film is obtained (Step S20).

Here, the amount of the position variation is defined by, for example, a deviation (distance) of the mask pattern when the multilayer film and the mask pattern are viewed from above. The position variation is caused by stress release in the multilayer film which occurs once the multilayer film is patterned.

Subsequently, a mask pattern of the underlying multilayer film is patterned. At this point, in some cases, the resulting mask pattern in the multilayer film deviates from the target position of the pattern. The mask pattern is formed on the multilayer film deviated in location thereon by the amount of the positional variation assuming deviation in the mask pattern location (Step S30).

Subsequently, the multilayer film is patterned using the mask pattern, for example, by Reactive Ion Etching (RIE) (Step S40).

Figure 2B:
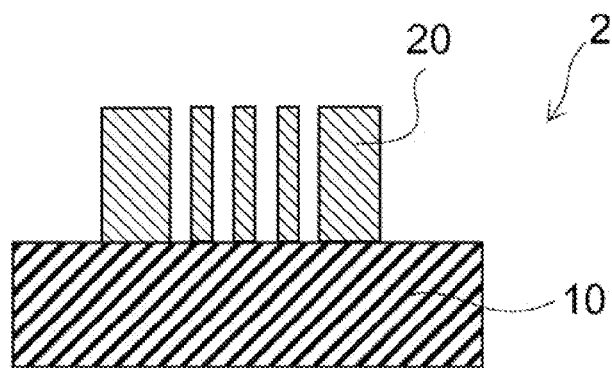
Figure 2C:
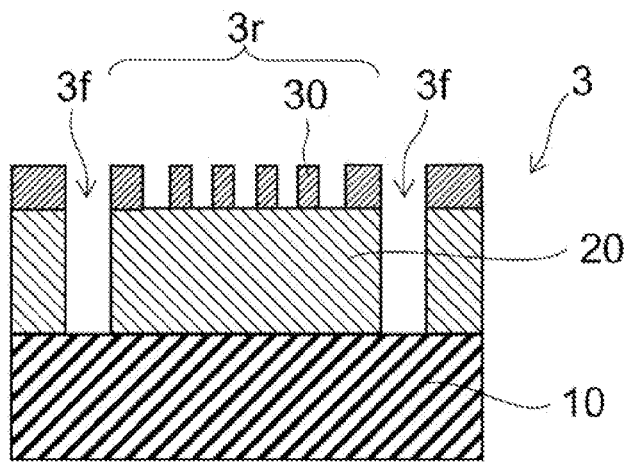

FIGS. 2A to 2C are cross-sectional views schematically illustrating steps in the manufacture of photomasks according to the embodiment.

In FIGS. 2A to 2C, a photomask 1 useful in EUV lithography in which EUV "light" having a wavelength of about 13.5 nm is used is illustrated. The photomask 1 is a reflective mask.

As illustrated in FIG. 2A, in the photomask 1, a multilayer film 20 is provided on a substrate 10, and a light absorber layer 30 is provided on the multilayer film 20. The multilayer film 20 is a film in which for example, molybdenum (Mo) films and silicon (Si) films are alternately arranged. The light absorber layer 30 is a layer including, for example, tantalum (Ta).

The multilayer film 20 is, for example, a film that reflects light, and the light absorber layer 30 is a layer that absorbs light. The thickness of the multilayer film 20 is, for example, 280 nm to 300 nm. The thickness of the light absorber layer 30 is, for example, 50 nm to 70 nm.

In lithography operations in which the reflective mask 1 is used, light for exposure is incident on the reflective mask, a semiconductor wafer (semiconductor substrate) is irradiated with the light reflected from the reflective mask for patterned exposure of the resist coating the substrate to transfer the mask pattern into the resist. In order to cause the light for exposure which is reflected on the reflective mask to have sufficient light contrast, it is required for the light absorber layer 30 to be thicker than a certain value.

Further, the incident angle of the light that is incident on the reflective mask is inclined by a predetermined angle (for example, 6°) from a normal line direction of the reflective mask, i.e., 6° from normal to the surface of the underlying mask substrate 10. Therefore, in some cases, projection effect (shadowing effect) occurs in the pattern transferred to the resist on the semiconductor wafer, depending in part on the pattern thickness of the reflective mask.

During lithography, if the line pattern extending in the vertical direction to the inclined incident light is transferred to the semiconductor wafer, and if the line pattern extending in the horizontal direction to the inclined incident light is transferred to the semiconductor wafer, differences are generated between the mask pattern and the pattern formed on the lithography target such as a semiconductor wafer. Particularly, when the line pattern in the horizontal direction is transferred to the semiconductor wafer, the variations of the line pattern size are reflected to form the pattern provided in the semiconductor wafer. Therefore, the tolerance in the wafer process is decreased.

As a technique of decreasing the projection effect, there is a method in which the light absorber layer 30 is removed, and the line pattern is formed directly in the multilayer film 20 itself, as seen in a photomask 2 illustrated in FIG. 2B. That is, the method is to perform patterning of the circuit pattern to be transferred to the semiconductor wafer directly on the multilayer film 20.

Further, as another method of decreasing the projection effect, there is a method of causing the light absorber layer 30 to be an extremely thin film. However, the light shielding performance of the reflective mask is resultantly incomplete, and the influence of leaked light becomes great in the overlapped region between individual steps, and exposure shots, on the semiconductor wafer. The amount of the reflected light becomes large at the peripheral portion of the mask.

In order to avoid this phenomenon, as seen in a photomask 3 illustrated in FIG. 2C, there is a method of forming drains called light shielding frames 3f in the vicinity of an exposure region 3r of the reflective mask. For example, the method is to form the drains (light shielding frame) by removing portions of the light absorber layer 30, and the multilayer film 20 under the portions. In the light shielding frames 3f, the reflectance becomes 0.1% or less, and the influence of leaked light is avoided in the overlapped portion between shots.

Even if the influence of the projection effect and the influence of the leaked light are avoided, internal stress in the reflective mask is generated.

Figure 3A:
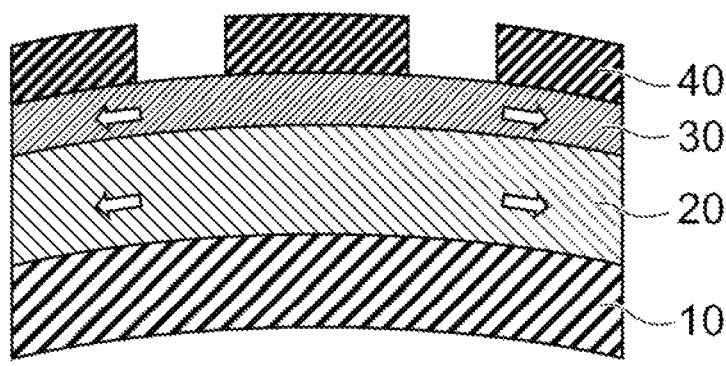
FIG. 3A is a cross-sectional view schematically illustrating a state in which internal stress is generated in the photomask.
Figure 3B:
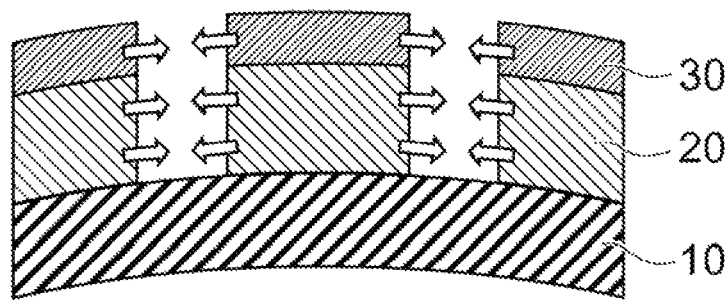
FIG. 3B is a cross-sectional view schematically illustrating a state in which the internal stress generated in the photomask is released.

FIG. 3A is a cross-sectional view schematically illustrating a state in which internal stress is generated in the photomask, and FIG. 3B is a cross-sectional view schematically illustrating a state in which the internal stress generated in the photomask is released.

In FIG. 3A, a state before a multilayer film is processed into a photomask is illustrated. For example, the multilayer film 20 before the process is provided on the substrate 10, and the light absorber layer 30 before the process is provided on the multilayer film 20. In FIG. 3A, a mask pattern 40 for patterning (pattern etching) the light absorber layer 30 and the multilayer film 20 is shown on the light absorber layer 30. The mask pattern 40 is drawn on the mask blank by, for example, Electron Beam (EB) exposure.

The multilayer film 20 is a film obtained by stacking films of different materials (for example, a molybdenum film and a silicon film) and possesses great internal stress. That is, before the process, in addition to the substrate 10, the multilayer film 20 and the light absorber layer 30 are distorted. In the drawing, as an example, a state in which the light absorber layer 30 or the multilayer film 20 is pulled from the center to the end is illustrated with arrows.

Therefore, as illustrated in FIG. 3B, if the multilayer film 20 or the light absorber layer 30 is partially removed, as illustrated by arrows in FIG. 3B, stress releasing occurs inside the multilayer film 20 or inside the light absorber layer 30 after the removal of the portions thereof. According to this, in some cases, the pattern feature positions after the process is deviated from the desired pattern feature position.

Figure 4A:
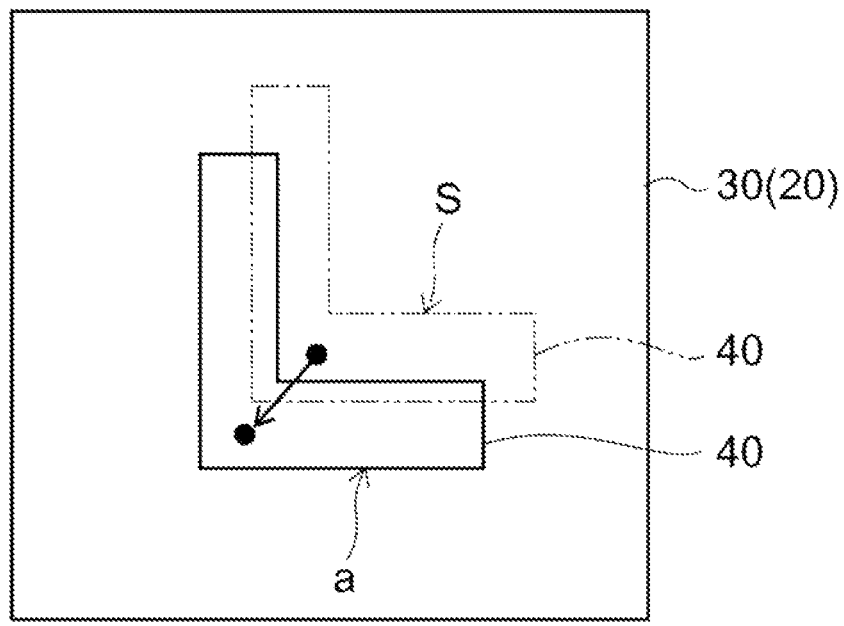
FIG. 4A is a plan view schematically illustrating a deviation of a position of a pattern.
Figure 4B:
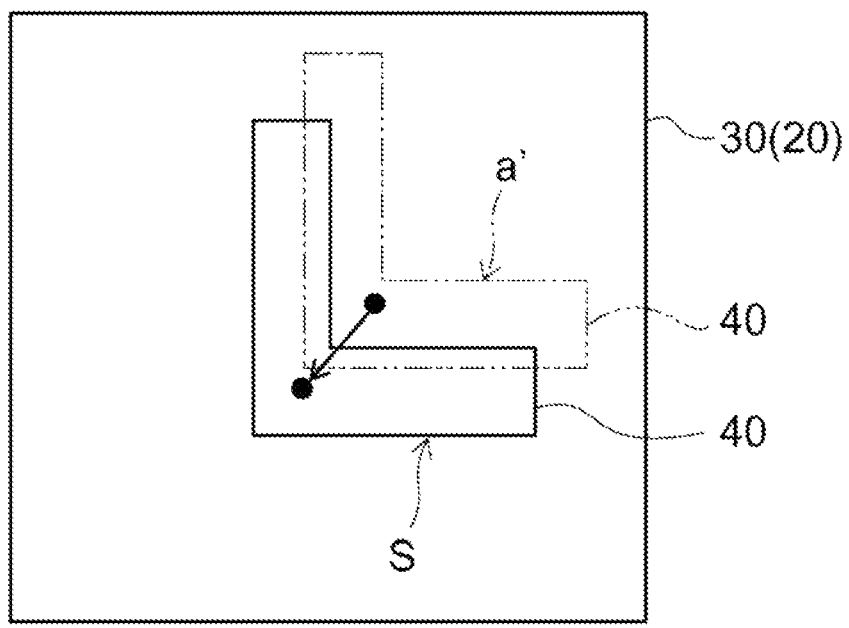
FIG. 4B is a plan view schematically illustrating deviation correction of the position of the pattern according to the embodiment.

FIG. 4A is a plan view schematically illustrating a deviation of a position of a pattern feature, and FIG. 4B is a plan view schematically illustrating deviation correction of the position of the pattern feature according to the embodiment.

In FIG. 4A, a state in which the stress releasing described above occurs and the light absorber layer 30 or the multilayer film 20 is subjected to RIE through the mask pattern 40 is illustrated.

For example, a position of the pattern feature which is formed on the photomask is set at a target position s. As illustrated in FIG. 4A, if the mask pattern 40 for the pattern feature is positioned at the target position s, stress releasing occurring during and after the pattern openings are formed in the RIE step distorts or deviates the position of the mask pattern 40 to a position a. That is, the pattern on the light absorber layer 30 or the multilayer film 20 is not formed at the target position s.

In the embodiment, in order to correct the deviation, as illustrated in FIG. 4B, the mask pattern 40 is formed on the light absorber layer 30 or the multilayer film 20 so that upon the etching of the openings the resulting relieved mask pattern 40 is deviated in a direction of cancelling the deviation in a direction (first direction) in which the mask pattern 40 is deviated. According to the deviation in this manner, if stress releasing occurs in the RIE step, the mask pattern 40 ends up at the target position s by moving from the intentionally deviated position, and the pattern on the light absorber layer 30 or the multilayer film 20 is formed at the target position s.

In the embodiment, if the mask pattern 40 is deviated by the amount of the position variation in the first direction, the mask pattern is deviated in a direction of cancelling the deviation in the first direction during drawing the mask pattern 40 so that the mask pattern 40 is formed on the light absorber layer 30 or the multilayer film 20. That is, the amount of the position variation of the mask pattern 40 is corrected by a pattern drawing device.

Alternatively, the data of the mask pattern 40 may be created by deviating (moving or shifting) the mask pattern 40 in a direction which cancels out the deviation in the first direction during creation of the mask pattern 40 data, and the mask pattern 40 may then be formed on the light absorber layer 30 or the multilayer film 20 based on the mask pattern 40 data which includes offsets in position to compensate for stress relief induced deviations in the position thereof. That is, the amount of the position variation of the mask pattern 40 may be corrected by the Computer Assisted Drafting (Drawing) (CAD) data used to design the mask and maintain the drawing file for the mask.

Stress, or a stress distribution, of at least any one of the substrate 10 and the multilayer film 20 is directly or indirectly measured. Further, the amount of the position variation of a pattern is obtained from the measured measurement result and the pattern layout formed on the semiconductor wafer.

Here, for example, the respective positional deviations of a plurality of positions of the substrate 10 and the multilayer film 20 to measure the stress or the stress distribution of the substrate 10 and the multilayer film 20 are directly measured. In this direct measurement, correction is applied to the next mask manufactured having an identical or similar layout to the measured mask.

Further, using an indirect measurement method, the deformation of the substrate 10 generated by the formation of the multilayer film 20 on the substrate 10 is used as an indirect measure of the stress or the stress distribution of the substrate 10 and the multilayer film 20 based on a result obtained by measuring the deformation. Using the indirect measurement method, it is possible to perform correction when the pattern writing on the mask blank is performed on the mask used in the measurement and to apply corrections when a next mask having an identical or similar layout to the corresponding mask is manufactured.

A specific photomask manufacturing method is described. Here, a method of manufacturing the aforementioned photomask 2 is described.

Figure 5A:
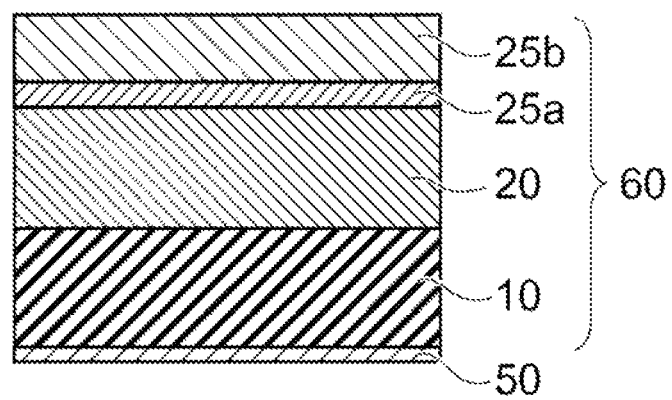
FIG. 5A is a cross-sectional view schematically illustrating a state before the photomask is processed according to the embodiment.
Figure 5B:
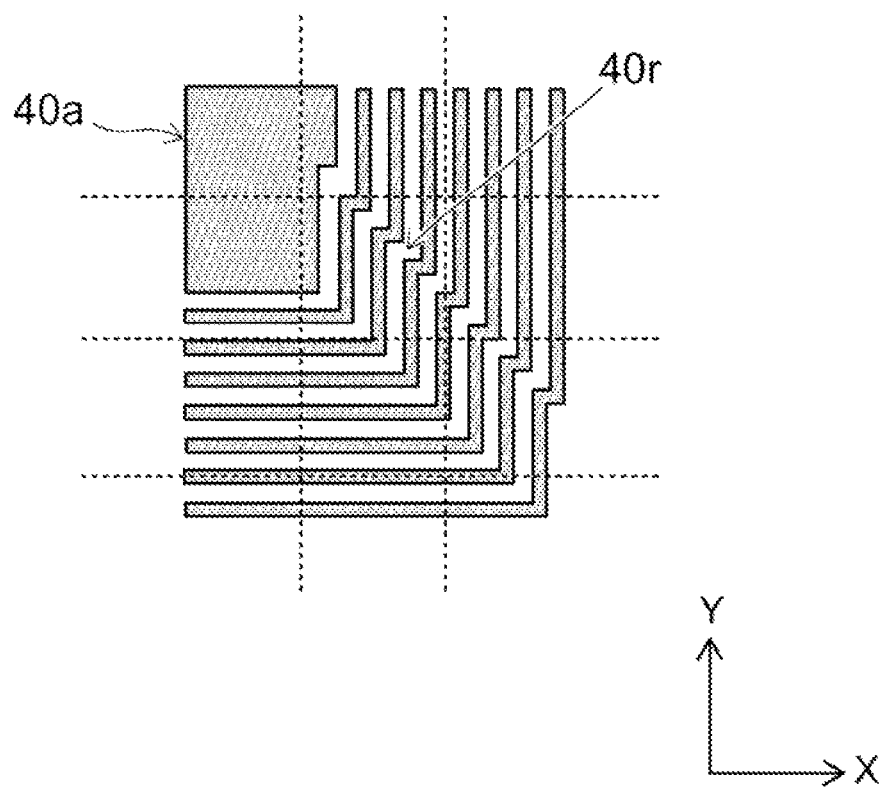
FIG. 5B is a plan view schematically illustrating the mask pattern for patterning the photomask.

FIG. 5A is a cross-sectional view schematically illustrating a state before the photomask is processed according to the embodiment, and FIG. 5B is a plan view schematically illustrating the mask pattern for patterning the photomask.

For example, a glass substrate having an extremely small thermal expansion coefficient is chosen as the substrate 10, and a mask blank 60 including multiple coating films on the substrate 10 is prepared as illustrated in FIG. 5A. For example, the multilayer film 20 is formed on the substrate 10. In the multilayer film 20, about 40 sets of stacks of Mo films and Si films are formed alternatively one over the other. The multilayer film 20 is formed by a sputtering method. Further, a Si film is formed as the outermost surface of the multilayer film 20.

Further, a capping layer 25a is formed on the multilayer film 20, and a layer 25b is formed on the capping layer 25a. The capping layer 25a includes, for example, ruthenium (Ru). The layer 25b includes tantalum nitride (TaN) and tantalum oxide (TaO). Further, a conductive film 50 including chromium nitride (CrN) is formed on the backside surface of the mask blank 60 so that the mask blank 60 may be maintained and fixed by an electrostatic chuck.

Subsequently, before the mask pattern 40 is formed on the mask blank 60, the amount of the position variation of the mask pattern 40 is estimated in advance.

For example, as illustrated in FIG. 5B, the mask pattern 40a in the data is partitioned into a plurality of rectangular regions 40r in an X direction and a Y direction. The size of the rectangular regions 40r is, for example, about 250 μm². Subsequently, respective opening ratios of the plurality of rectangular regions 40r are calculated. Here, the opening ratio may be presented by (B/A)×100% where a size of a planar area of the rectangular region 40r is A, and a size of an exposed area of the mask blank 60 which is opened from the mask pattern 40a is B in the rectangular region 40r.

According to the embodiment, opening ratios of adjacent or nearby rectangular regions 40r are compared and the amount of feature position variation corresponding to the difference is estimated. Areas of different opening ratios will result in different positional deviation or offset, based on the amount of material removed compared to that remaining adjacent that removed. The amount of the position variation according to the difference of the opening ratio is presented by a value having an internal stress value of the multilayer film 20 as a coefficient.

The pattern position variation amount is qualitatively presented by Equation (1) as below.

$$\Delta P(x,y) = k \cdot F(x,y) \times C(x,y) \tag{1}$$

Here, $\Delta P$ is a vector of the amount of the position variation of the mask pattern 40a, and F is a vector of the internal stress of the substrate 10. C is a factor relating to an opening ratio of the mask pattern 40a, and a vector value showing an opening ratio of the mask pattern 40a in the X axis direction and the Y axis direction with a point (x,y) as a center.

For example, if a mask pattern 40 having a high opening ratio is on the positive side in the X axis direction, and a mask pattern 40 having a low opening ratio is on the negative side thereof, a vector C becomes a positive value. In addition, if the difference between the opening ratios of both of the mask patterns 40 is large, the value the vector is large. Here, k is an arbitrary coefficient.

After writing the mask pattern with compensated mask pattern data based on the opening ratios across the pattern, a reflective mask including a desired pattern is manufactured from the mask blank 60.

Figure 6A:
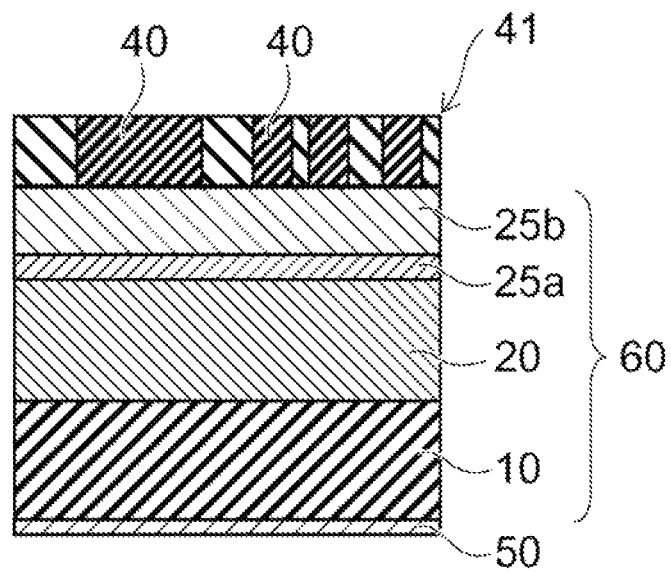
FIGS. 6A and 6B are cross-sectional views schematically illustrating states in which the photomask is patterned according to the embodiment.
Figure 6B:
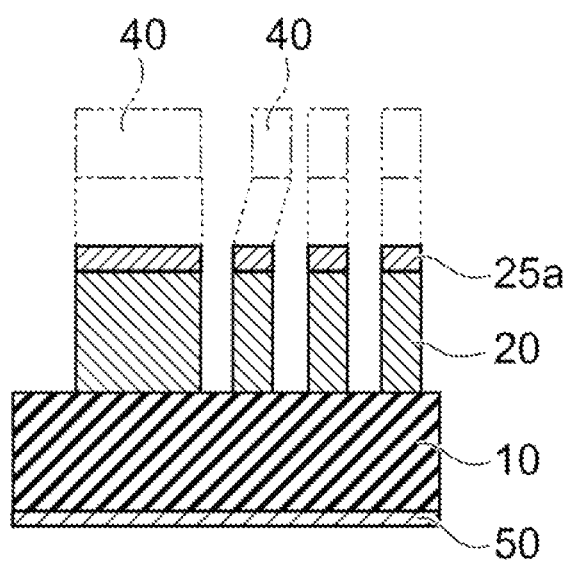

FIGS. 6A and 6B are cross-sectional views schematically illustrating states in which the photomask is patterned according to the embodiment.

In the mask blank 60, a positive chemically amplified resist 41 is applied, and the mask patterns 40 are drawn on the chemically amplified resist 41 using an electron beam (EB) writing device. At this time, in view of the amount of the calculated pattern position variations, the mask patterns 40 are drawn at positions deviated in advance in a direction intended to cancel out, after stress relief in the film, the calculated pattern position variations. Thereafter, post exposure bake (PEB) and development are performed on the resist 41, followed by removal of the exposed resist, such that the mask pattern 40 remains on the mask blank 60.

Subsequently, the mask blank 60 exposed with the mask pattern 40 is etched by RIE (reactive ion etching) as illustrated in FIG. 6B. Here, the RIE is performed through the multilayer film 20. After the RIE step, the mask pattern 40 and the layer 25b are removed. In this manner, the circuit pattern is formed on the multilayer film 20 at the target position.

In FIG. 6B, original positions of the mask patterns 40 are illustrated. In at least a portion of the mask patterns 40, the drawn positions (dashed outline) may be deviated from the positions thereof in the circuit pattern (real pattern) on the multilayer film 20. This is caused by drawing a mask pattern 40 in which the mask pattern 40 is deviated in a direction to cancel the amount of the position variation caused when the film stress relieves when it is penetrated to form the mask pattern.

If the EUV lithography is performed by using the photomask formed in this manner, the overlay with a ground layer is improved, and the manufacturing yield in the wafer process is enhanced.

In the above, the embodiments are described with reference to the specific examples. However, the embodiments are not limited to the specific examples. That is, even if these specific examples are appropriately changed in design by those skilled in the art, as long as the changed specific examples include the characteristics of the embodiments, the changed specific examples are included in the embodiments. Each of the elements included in each of the aforementioned examples, and arrangements, materials, conditions, forms, sizes and the like thereof are not limited as described in the examples, and may be appropriately changed.

Further, each aforementioned element included in each embodiment may be combined only when the combination is technically possible, the combined element is included in the scope of the embodiment as long as the combined element includes the characteristics of the embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of patterning multilayer films using mask patterns provided on the multilayer films, the method comprising:
   preparing a first multilayer film provided on a first substrate, the first multilayer film including first molybdenum films alternately stacked with first silicon films;
   forming a first etch mask pattern on the first multilayer film;
   patterning the first multilayer film to form a first resulting pattern therein using the first etch mask pattern;
   measuring an amount of position variation between the first resulting pattern formed in the first multilayer film and a target pattern, the position variation being due to release of stress in the first multilayer film in response to the step of patterning the first multilayer film;
   preparing a second multilayer film provided on a second substrate, the second multilayer film including second molybdenum films alternately stacked with second silicon films;
   forming a second etch mask pattern on the second multilayer film at a position based on the amount of the position variation measured for the first multilayer film; and
   patterning the second multilayer film to form a second resulting pattern therein using the second etch mask pattern.

2. The method according to claim 1, wherein in the step of forming the second etch mask pattern, the second etch mask pattern is offset from a target position in a first direction opposite to a direction of the amount of the position variation measured for the first multilayer film.

3. The method according to claim 1, wherein each of the steps of forming the first etch mask pattern and the second etch mask pattern comprises writing the respective first and second etch mask patterns onto a respective resist layer located on the respective first and second multilayer films.

4. The method according to claim 1, wherein the step of forming the second etch mask pattern includes:
   creating etch mask pattern data to be used in forming the second etch mask pattern such that the second etch mask pattern is offset from a target position in a first direction opposite to a direction of the amount of the position variation measured for the first multilayer film; and
   forming the second etch mask pattern based on the etch mask pattern data.

5. The method according to claim 1, wherein
   the amount of the position variation measured for the first multilayer film is obtained from a measured result on a previously manufactured mask or an evaluation of the pattern opening area.

6. The method according to claim 1, wherein the step of measuring the amount of the position variation comprises:
   measuring the stress, or a stress distribution, of the first substrate and the first multilayer film by measuring respective positional deviations at a plurality of positions of the first substrate and the first multilayer film.

7. The method according to claim 1, wherein the step of measuring the amount of the position variation comprises:
   measuring deformation of the first substrate, which is generated by the first multilayer film formed on the first substrate, and
   determining the stress and a stress distribution of the first substrate and the first multilayer film based on the measured deformation of the first substrate.

8. The method according to claim 1,
   wherein the amount of the position variation measured for the first multilayer film is caused by stress releasing of the film multilayer film which results when portions of the first multilayer film are removed during the step of patterning thereof.

9. The method according to claim 1, further comprising:
   forming a light absorber layer on the second multilayer film, and
   removing, during the patterning the second multilayer film, a portion of the light absorber layer and the second multilayer film under the portion of the light absorber layer.

10. The method according to claim 1, further comprising:
    in the step of patterning the second multilayer film, patterning a circuit pattern on the second multilayer film.

11. The method according to claim 9, further comprising forming a light shielding frame at a location where the portion of the light absorber layer and the second multilayer film under the portion of the light absorber layer have been removed.

12. The method according to claim 1, wherein the second substrate is a glass substrate.

13. The method according to claim 1, wherein the second substrate includes a conductive film formed on a second surface thereof, the second surface being opposite a first surface on which the second multilayer film is formed.

14. The method according to claim 1, further comprising forming a first layer on the second multilayer film, the first layer including ruthenium.

15. The method according to claim 14, further comprising forming a second layer on the first layer, the second film including tantalum nitride and tantalum oxide.

16. A method of patterning multilayer films using mask patterns provided on the multilayer films, the method comprising:
    preparing a first multilayer film provided on a first substrate, the first multilayer film including first molybdenum films alternately stacked with first silicon films;

forming a first etch mask pattern on the first multilayer film;

patterning the first multilayer film to form a first resulting pattern therein using the first etch mask pattern;

measuring deformation of the first substrate generated by the first multilayer film formed on the first substrate;

estimating stress and a stress distribution of the first substrate and the first multilayer film based on the measured deformation of the first substrate;

obtaining an amount of position variation between the first resulting pattern formed in the first multilayer film and a target pattern, the amount of the position variation being determined based on the estimated stress and the estimated stress distribution of the first substrate and the first multilayer film;

preparing a second multilayer film provided on a second substrate, the second multilayer film including second molybdenum films alternately stacked with second silicon films;

forming a second etch mask pattern on the second multilayer film at a position based on the amount of the position variation obtained for the first multilayer film; and patterning the second multilayer film to form a second resulting pattern therein using the second etch mask pattern.

17. The method according to claim 16, wherein in the step of forming the second etch mask pattern, the second etch mask pattern is offset from a target position in a first direction opposite to a direction of the amount of the position variation obtained for the first multilayer film.

18. The method according to claim 16, wherein each of the steps of forming the first etch mask pattern and the second etch mask pattern comprises writing the respective first and second etch mask patterns onto a respective resist layer disposed on the respective first and second multilayer films.

19. The method according to claim 16, wherein the step of forming the second etch mask pattern includes:

creating etch mask pattern data for forming the second etch mask pattern such that the second etch mask pattern is offset from a target position in a first direction opposite to a direction of the amount of the position variation obtained for the first multilayer film; and forming the second etch mask pattern based on the etch mask pattern data.

20. The method according to claim 16, wherein
the amount of the position variation is obtained from a measured result on a previously manufactured mask or an evaluation of the pattern opening area.

21. The method according to claim 16, wherein the step of obtaining the amount of the position variation comprises:

measuring the stress, or a stress distribution, of the first substrate and the first multilayer film by measuring respective positional deviations at a plurality of positions of the first substrate and the first multilayer film.

22. The method according to claim 16,
wherein the amount of the position variation is caused by stress releasing of the first multilayer film which results when portions of the first multilayer are removed during patterning thereof.

23. The method according to claim 16, further comprising:

forming a light absorber layer on the second multilayer film, and removing, during the patterning the second multilayer film, a portion of the light absorber layer and the second multilayer film under the portion of the light absorber layer.

24. The method according to claim 16, further comprising:

in the step of patterning the second multilayer film, patterning a circuit pattern on the second multilayer film.

25. The method according to claim 23, further comprising forming a light shielding frame at a location where the portion of the light absorber layer and the second multilayer film under the portion of the light absorber layer have been removed.

* * * * *